(12) United States Patent
Li

(10) Patent No.: US 11,996,379 B1
(45) Date of Patent: May 28, 2024

(54) FILTER PACKAGE STRUCTURE AND METHOD FOR PREPARING SAME

(71) Applicant: GUANGZHOU AIFO LIGHT COMMUNICATION TECHNOLOGY COMPANY LTD., Guangzhou (CN)

(72) Inventor: Guoqiang Li, Shanghai (CN)

(73) Assignee: GUANGZHOU AIFO LIGHT COMMUNICATION TECHNOLOGY COMPANY LTD., Guangzhou (CN)

( * ) Notice: Subject to any disclaimer, the term of this patent is extended or adjusted under 35 U.S.C. 154(b) by 0 days.

(21) Appl. No.: 18/472,244

(22) Filed: Sep. 22, 2023

(30) Foreign Application Priority Data

May 23, 2023 (CN) .......................... 202310581348.3

(51) Int. Cl.
*H03H 9/64* (2006.01)
*H01L 23/00* (2006.01)
*H01L 23/31* (2006.01)

(52) U.S. Cl.
CPC .......... *H01L 24/13* (2013.01); *H01L 23/3121* (2013.01); *H01L 24/16* (2013.01); *H01L 24/81* (2013.01); *H01L 24/97* (2013.01); *H01L 2224/13078* (2013.01); *H01L 2224/16227* (2013.01); *H01L 2224/81815* (2013.01); *H01L 2224/97* (2013.01)

(58) Field of Classification Search
None
See application file for complete search history.

(56) References Cited

U.S. PATENT DOCUMENTS

| 2005/0146397 | A1  | 7/2005 | Koga et al. |            |
|--------------|-----|--------|-------------|------------|
| 2017/0250669 | A1* | 8/2017 | Kuroyanagi  | H03H 9/02574 |
| 2023/0039933 | A1* | 2/2023 | Jiang       | H03H 9/131 |

FOREIGN PATENT DOCUMENTS

| CN | 108512523  | A  | 9/2018  |
| CN | 111003682  | A  | 4/2020  |
| CN | 113675101  | A  | 11/2021 |
| CN | 216120295  | U  | 3/2022  |
| CN | 115065336  | A  | 9/2022  |
| CN | 115987241  | A  | 4/2023  |
| JP | 2018160829 | A  | 10/2018 |
| WO | 2023085362 | A1 | 5/2023  |

* cited by examiner

*Primary Examiner* — Long Pham

(57) ABSTRACT

A filter package structure includes: a die substrate, a substrate, a solder resist layer, a package layer, and a conductive structure disposed; wherein the solder resist layer is disposed on the substrate, and a plurality of channels are formed in the solder resist layer, each of the channels being provided with a solder; the conductive structure includes a seal wall and a support electrode, the seal wall and one terminal of the support electrode being connected to the substrate via the solder; and the die substrate is provided with a filter, wherein the seal wall is disposed around a periphery of the filter, the die substrate, the substrate and the seal wall enclose to define an enclosed chamber, the support electrode is disposed in the enclosed chamber, and the package layer is disposed on a periphery, far away from the enclosed chamber, of the die substrate.

8 Claims, 10 Drawing Sheets

FILTER PACKAGE STRUCTURE AND METHOD FOR PREPARING SAME

CROSS-REFERENCE TO RELATED APPLICATION

This application is based upon and claims priority to Chinese Patent Application No. 202310581348.3, filed on May 23, 2023 and entitled "FILTER PACKAGE STRUCTURE AND METHOD FOR PREPARING SAME," the disclosure of which is incorporated herein by reference in its entirety.

TECHNICAL FIELD

The present disclosure relates to the technical field of die packaging, and in particular, relates to a filter package structure and a method for preparing the same.

BACKGROUND

With rapid developments of the fifth-generation (5G) mobile communication technology, stricter requirements are imposed on performance of radio-frequency front-end filters. Acoustic filters have been widely used in the field of mobile communications due to good performance and small size. At present, the most widely used acoustic filters include surface acoustic wave (SAW) filters and bulk acoustic wave (BAW) filters.

Both the SAW filters and the BAW filter impose some requirements on working environment. Specifically, a relatively closed chamber needs to be prepared to isolate adverse impacts caused by external moisture, particles, dirts, and the like. Therefore, a package structure is needed to protect the filter on the surface of the wafer from impacts by the external environment.

Conventional filter package structures are typically wafer-class package structures to protect the filters. However, the wafer-class package structure is complex, such that the entire package process takes a long time, and thus manufacture efficiency of the filter package structures is low.

SUMMARY

Embodiments of the present disclosure are intended to address the technical problem that conventional wafer package structures are complex and take a long manufacture process.

The embodiments of the present disclosure provide a filter package structure.

The filter package structure includes: a die substrate, a substrate, a solder resist layer, a package layer, and a conductive structure disposed between the die substrate and the substrate.

The solder resist layer is disposed on the substrate, and a plurality of channels are formed in the solder resist layer, each of the channels being provided with a solder.

The conductive structure includes a seal wall and a support electrode, the seal wall and one terminal of the support electrode being connected to the die substrate, and the seal wall and the other terminal of the support electrode being disposed in one of the channels and connected to the substrate via the solder.

The die substrate is provided with a filter, wherein the seal wall is disposed around a periphery of the filter, the die substrate, the substrate and the seal wall enclose to define an enclosed chamber, the support electrode is disposed in the enclosed chamber and between the filter and the seal wall, and the package layer is disposed on a periphery, far away from the enclosed chamber, of the die substrate.

In some embodiments, a difference between a height of the seal wall on the die substrate and a height of the support electrode on the die substrate is less than 1 μm.

In some embodiments, the height of the seal wall on the die substrate ranges from 5 to 30 μm, and the height of the support electrode on the die substrate ranges from 5 to 30 μm.

In some embodiments, at least two support electrodes are disposed, and the two support electrodes are symmetrically distributed about a central line of the filter.

In some embodiments, the conductive structure further includes a first electrode connection layer and a second electrode connection layer, wherein the first electrode connection layer and the second electrode connection layer are both disposed on the substrate.

The first electrode connection layer is in correspondence with the seal wall and the seal wall is connected to the substrate via the first electrode connection layer such that the die substrate, the substrate, the seal wall and the first electrode connection layer enclose to define the enclosed chamber, and the second electrode connection layer is in correspondence with the support electrode, and the support electrode is connected to the substrate via the second electrode connection layer.

The first electrode connection layer and the second electrode connection layer are both disposed in the channel, a height of the solder resist layer on the substrate is greater than a height of the first electrode connection layer on the substrate, the height of the solder resist layer on the substrate is greater than a height of the second electrode connection layer on the substrate, and the solder is disposed on both the first electrode connection layer and the second electrode connection layer.

The embodiments of the present disclosure further provide a method for preparing the filter package structure.

The method includes: preparing seal walls and support electrodes on a wafer substrate of filters to obtain a finished wafer, wherein the seal walls are disposed around peripheries of the filters and defines enclosed chambers, and the support electrodes are respectively disposed in the enclosed chambers and between the filters and the seal walls; cutting the finished wafer into a plurality of dies, wherein each of the dies includes a die substrate, a filter, the seal walls and the support electrodes; preparing solder layers on electrodes on the substrate, and disposing solder resist layers on peripheries of the solder layer to obtain a finished substrate, wherein a height of the solder resist layers on the substrate is greater than a height of the solder layers on the substrate; bonding and reflow soldering the dies to the finished substrate such that the seal walls and the support electrodes are connected to the electrodes on the finished substrate via a solder of the solder layers to obtain a solder structure, wherein in the solder structure, the die substrate, the substrate and the seal walls enclose to define an enclosed chamber, and the support electrodes are disposed in the enclosed chamber; and disposing a package layer on the solder structure, and cutting the package layer to obtain the filter package structure;

In some embodiments, preparing the solder layers on the electrodes on the substrate includes: disposing first electrode connection layers and second electrode connection layers on the electrodes on the substrate; and disposing the solder layers on the first electrode connection layers and the second electrode connection layers.

In some embodiments, bonding and reflow soldering the plurality of dies to the finished substrate such that the seal walls and the support electrodes are connected to the electrodes on the finished substrate via the solder of the solder layers to obtain the solder structure includes: flipping and placing the plurality of dies on the same finished substrate, and under a first predetermined temperature, causing the seal walls to be pre-bonded to the first electrode connection layers and causing the support electrodes to be pre-bonded to the second electrode connection layers to obtain a pre-assembled structure, wherein in the pre-assembled structure, the die substrate, the substrate, and the seal walls enclose to define the enclosed chambers; and reflow soldering the pre-assembled structure such that the seal walls and the first electrode connection layers are connected via the solder of the solder layers and the support electrodes and the second electrode connection layers are connected via the solder of the solder layers, and obtaining the solder structure, wherein the solder structure is an assembled structure formed of the plurality of dies and the finished substrate.

In some embodiments, disposing the package layer on the solder structure, and cutting the package layer to obtain the filter package structure includes: plastic packaging the solder structure such that a material for plastic packaging is deployed on a periphery, away from the enclosed chambers, of the die substrate to form the package layer, and obtaining an assembled package structure, wherein the assembled package structure is an assembled structure formed of the plurality of dies and the finished substrate; and cutting the assembled package structure such that the plurality of dies are separated from each other, and obtaining an individual filter package structure.

In some embodiments, prior to cutting the finished wafer into the plurality of dies, the method further includes: attaching a protective film on the finished wafer, wherein the protective film is attached on the seal walls and one terminal, away from the wafer substrate of the filter, of the support electrodes, such that the filters are in the enclosed chambers; and thinning the wafer substrate of the filters; and prior to bonding and reflow soldering the plurality of dies to the finished substrate, the method further includes: releasing the protective film from the seal walls and the support electrodes.

BRIEF DESCRIPTION OF THE DRAWINGS

For clearer descriptions of technical solutions according to the embodiments of the present disclosure, drawings that are to be referred for description of the embodiments are briefly described hereinafter. Apparently, the drawings described hereinafter merely illustrate some embodiments of the present disclosure. Persons of ordinary skill in the art may also derive other drawings based on the drawings described herein without any creative effort.

Figure 1:
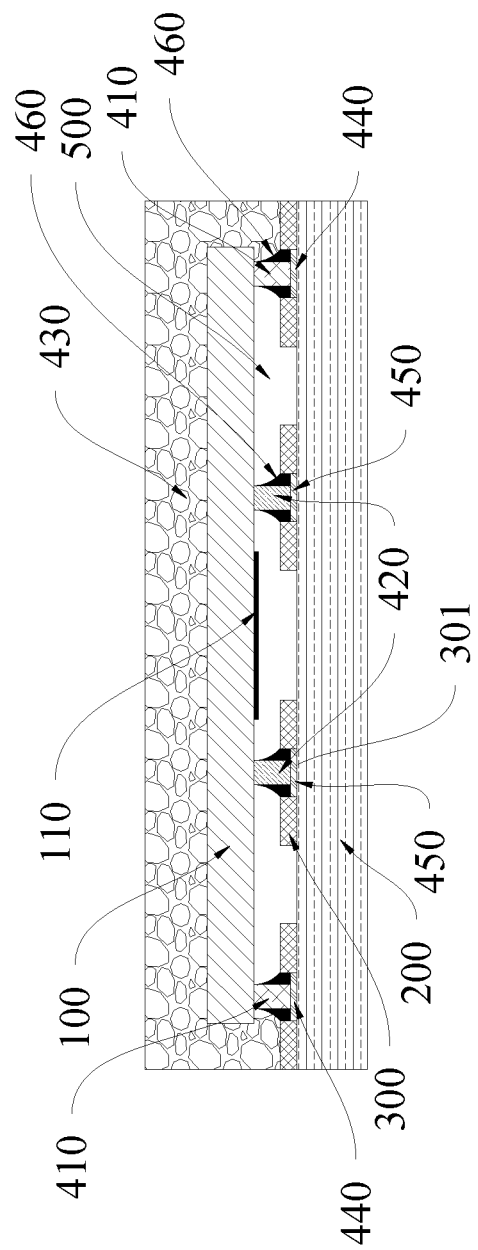
FIG. 1 is a schematic structural view of a filter package structure according to an embodiment of the present disclosure.
Figure 2:
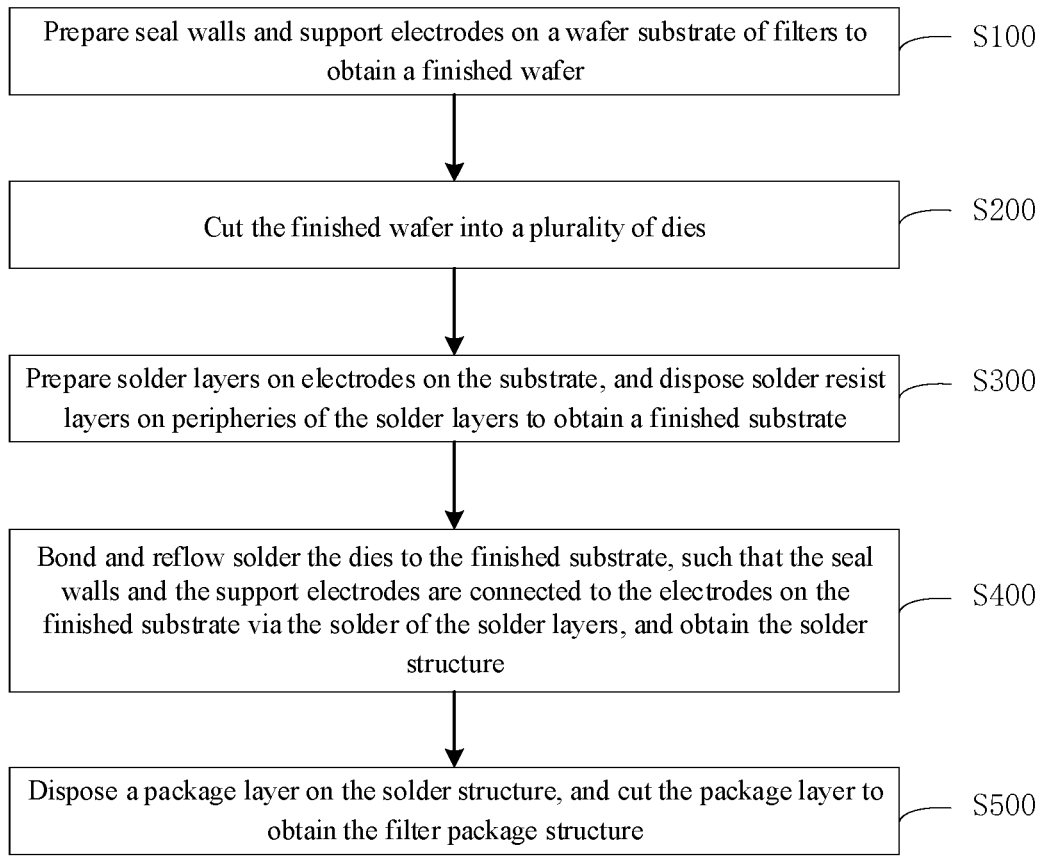
FIG. 2 is a schematic flowchart of a method for preparing a filter package structure according to an embodiment of the present disclosure.

Reference numerals and denotations thereof:
100—die substrate; 110—filter; 200—substrate; 300—solder resist layer; 301—channel;
410—seal wall; 420—support electrode; 430—package layer; 440—first electrode connection layer; 450—second electrode connection layer; 460—solder layer; and
500—enclosed chamber.

DETAILED DESCRIPTION

Unless defined otherwise, all technical and scientific terms used herein have the same meaning as commonly understood by one of ordinary skill in the art to which the present disclosure pertains. The terms used herein in the specification of present disclosure are only intended to illustrate the specific embodiments of the present disclosure, instead of limiting the present disclosure. The terms "comprise," "include," and any variations thereof in the specification, claims, and the description of the drawings of the present disclosure are intended to cover a non-exclusive inclusion. The terms such as "first," "second," and the like in the specifications, claims or the accompanying drawings of the present disclosure are intended to distinguishing different objects but are not intended to define a specific sequence.

The terms "example" and "embodiment" in this specification signify that the specific characteristic, structures or features described with reference to the embodiments may be covered in at least one embodiment of the present disclosure. This term, when appears in various positions of the description, neither indicates the same embodiment, nor indicates an independent or optional embodiment that is exclusive of the other embodiments. A person skilled in the art would implicitly or explicitly understand that the embodiments described in this specification may be incorporated with other embodiments.

As illustrated in FIG. 1, an embodiment of the present disclosure provides a filter package structure. The filter package structure includes: a die substrate 100, a substrate 200, solder resist layers 300, a package layer 430, and a conductive structure disposed between the die substrate 100 and the substrate 200.

The solder resist layers 300 are disposed on the substrate 200, channels 301 are formed in the solder resist layers 300, and solder is provided in the channel 301.

The conductive structure includes seal walls 410 and support electrodes 420. The seal walls 410 and one terminals of the support electrodes 420 are connected to the die substrate 100, and the seal walls 410 and the other terminals of the support electrodes 420 are disposed in the channels 301 and are connected to the substrate 200 via the solder.

Filters 110 are disposed on the die substrate 100. The seal walls 410 are disposed around a periphery of the filter 110. The die substrate 100, the substrate 200, and the seal walls 410 enclose to define enclosed chambers 500. The support electrodes 420 are disposed in the enclosed chambers 500 and between the filter 110 and the seal walls 410. The package layer 430 is disposed on a periphery, away from the enclosed chambers 500, of the die substrate 100.

In this embodiment, with the seal walls 410 and the support electrodes 420 on the die substrate 100, the filters 110 are capable of being packaged, via the seal walls 410, in the enclosed chambers 500 between the die substrate 100 and the substrate 200; and with the solder resist layers 300, the solder is prevented from irregularly flowing when the seal walls 410 and the support electrodes 420 are connected to electrodes on the substrate 200, such that the security and reliability during the manufacture process are both ensured. In the filter package structure according to this embodiment, the package layer 430 is further disposed on a periphery of the enclosed chambers 500, such that double-layer protection by the seal walls 410 and the package layer 430 is achieved for the filters 110. Therefore, a seal effect for the devices is enhanced, and the filters 110 are ensured to be isolated from the external environment. The filter package structure according to the embodiments of the present disclosure is simple. A wafer-class package structure is no longer needed on the filters 110. In this way, a better seal effect is achieved, and further the manufacture complexity is lowered, such that the manufacture period of the filter structure is shortened, the package efficiency is improved, and the manufacture cost is reduced.

In this embodiment, a difference between a height of each of the seal walls 410 on the die substrate 100 and a height of each of the support electrodes 420 on the die substrate 100 is less than 1 μm, such that better height uniformities of the seal walls 410 and the support electrodes 420 on the same die substrate 100 are achieved, and during the manufacture process, the seal walls 410 and the support electrodes 420 on the same die substrate 100 are bonded to the electrodes on the substrate 200 simultaneously, which improves the yield of the filter package structure.

In this embodiment, on the same die substrate 100, the height uniformity of the seal walls 410 is less than 10%; and on the same die substrate 100, the height uniformity of the support electrodes 420 is less than 10%.

It should be noted that the height of the seal wall 410 refers to a distance from an end face, away from the die substrate 100, of the seal wall 410 to the die substrate 100. It should be noted that the height of the support electrode 420 refers to a distance from an end face, away from the die substrate 100, of the support electrode 420 to the die substrate 100.

In this embodiment, the height of the seal wall 410 on the die substrate 100 ranges from 5 to 30 μm, and the height of the support electrode 420 on the die substrate 100 ranges from 5 to 30 μm.

In this embodiment, the seal walls 410 are made of a conductive material. Specifically, the seal walls 410 are made of one of gold, copper, or aluminum.

In this embodiment, the support electrodes 420 are made of a conductive material. Specifically, the support electrodes 420 are made of one of gold, copper, or aluminum.

It should be noted that the seal walls 410 and the support electrodes 420 on the same die substrate 100 may be made of the same or different materials.

In some embodiments, the number of the support electrodes 420 is at least two, and the two support electrodes 420 are symmetrically distributed about a central line of the filter 110.

In this embodiment, the number of the support electrodes 420 is eight, the eight support electrodes 420 are disposed in the enclosed chambers 500 and around peripheries of the filters 110, and the eight support electrodes 420 are symmetrically distributed about central lines of the filters 110.

It may be understood that in this embodiment, the enclosed chambers 500 are supported by the support electrodes 420, which prevents deformation of the enclosed chambers 500 due to too large suspended areas, and ensures that the substrate 200 is not in direct contact with the filters 110. When the die substrate 100 and/or the substrate 200 are subjected to an external force, the support electrodes 420 distributed about the central lines of the filters 110 are capable of helping uniformly sustain the force. In this way, the security of the manufacture process is improved, the filters 110 are prevented from being in contact with the substrate 200 or other structures, and the filters 110 are protected.

It should be noted that in this embodiment, the central line of the filter 110 refers to a horizontal axis and/or longitudinal axis traveling through the center of the filter 110. It may be understood that a distance from one support electrode 420 on the left side of the filter 110 to the filter 110 is at least equal to a distance from one support electrode 420 on the right side of the filter 110 to the filter 110.

In this embodiment, four support electrodes 420 in the eight support electrodes 420 are electrically connected to signal input terminals and signal output terminals of the filters 110.

In this embodiment, some or all of the support electrodes 420 may achieve an effect of connecting the signal input terminals to the signal output terminals of the filters 110. In this way, the issue of great insert loss of the filters 110 due to long signal lines thereof is addressed, and the performance of the filter package structure is enhanced.

In this embodiment, the conductive structure further includes first electrode connection layers 440 and second electrode connection layers 450. The first electrode connection layer 440 and the second electrode connection layer 450 are both disposed on the substrate 200.

The first electrode connection layers 440 are disposed corresponding to the seal walls 410, and the seal walls 410 are connected to the first electrode connection layers 440 via the solder, such that the die substrate 100, the substrate 200, and the seal walls 410, and the first electrode connection layers 440 enclose to define the enclosed chambers 500. The second electrode connection layers 450 are disposed corresponding to the support electrodes 420, and the support electrodes 420 are connected to the second electrode connection layers 450 via the solder.

The first electrode connection layers 440 and the second electrode connection layers 450 are disposed in the channels 301, a height the solder resist layers 300 on the substrate 200 is greater than a height of each of the first electrode connection layers 440 on the substrate 200 and greater than a height of each of the second electrode connection layers 450 on the substrate 200.

It may be understood that in this embodiment, the first electrode connection layers 440 are configured to connect the seal walls 410 to the substrate 200, and the second electrode connection layers 450 are configured to connect the support electrodes 420 to the substrate 200. The first electrode connection layers 440 and the second electrode connection layers 450 in one aspect support the seal walls 410 and the support electrodes 420, and in another aspect dissipate heat for the substrate 200.

In this embodiment, the height of each of the first electrode connection layers 440 on the substrate 200 ranges from 0.5 to 5 μm; and the height of each of the second electrode connection layers 450 on the substrate 200 ranges from 0.5 to 5 µm. The first electrode connection layers 440 and the second electrode connection layers 450 are spaced apart on the same horizontal plane of substrate 200, and a difference between the height of each of the first electrode connection layers 440 and the height of each of the second electrode connection layers 450 is less than 1 µm.

The first electrode connection layers 440 are made of the same material as the second electrode connection layers 450. Both the first electrode connection layer 440 and the second electrode connection layer 450 may be made of copper, gold, or any other conductive material. The solder may be tin, indium, or any other material available for reflow soldering.

In this embodiment, the solder resist layers 300 are made of an insulative material. Specifically, the solder resist layers 300 may be made of epoxy resin or polyimide.

It may be understood that the first electrode connection layers 440 are connected, in the channels 301 in the solder resist layers 300, to the seal walls 410; and the second electrode connection layers 450 are connected, in the channels 301 in the solder resist layers 300, to the support electrodes 420. It should be noted that the solder resist layers 300 on outer sides of the first electrode connection layers 440 are arranged separate from the solder resist layers 300 on the second electrode connection layers 450.

In this embodiment, bottom portions of the first electrode connection layers 440 and bottom portions of the second electrode connection layers 450 in the channels 301 are capable of directly running through the channels 301, and connected to the electrodes on the substrate 200.

In this embodiment, with the solder resist layers 300, flowing of the solder during the reflow soldering is restricted, and the reliability of the manufacture process is enhanced, the manufacture difficulty is lowered, and the manufacture yield is improved. With the solder resist layers 300, the first electrode connection layers 440 and the second electrode connection layers 450 are separated from the external environment, such that the first electrode connection layers 440 and the second electrode connection layers 450 are protected.

As illustrated in FIG. 1, and FIG. 6 to FIG. 11, based on the above filter package structure, an embodiment of the present disclosure further provides a method for preparing filter package structures. The method includes the following steps.

In S100, seal walls 410 and support electrodes 420 are prepared on a wafer substrate of filters to obtain a finished wafer.

Figure 6:
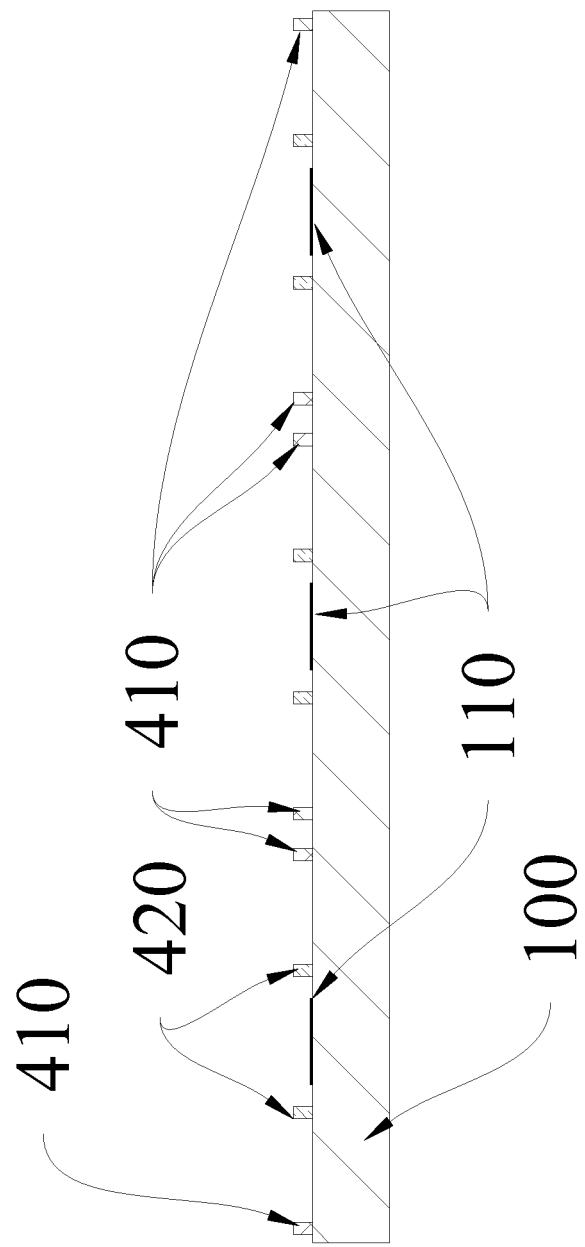
FIG. 6 is a schematic structural view of a finished wafer obtained in step S100 in FIG. 2.
Figure 8:
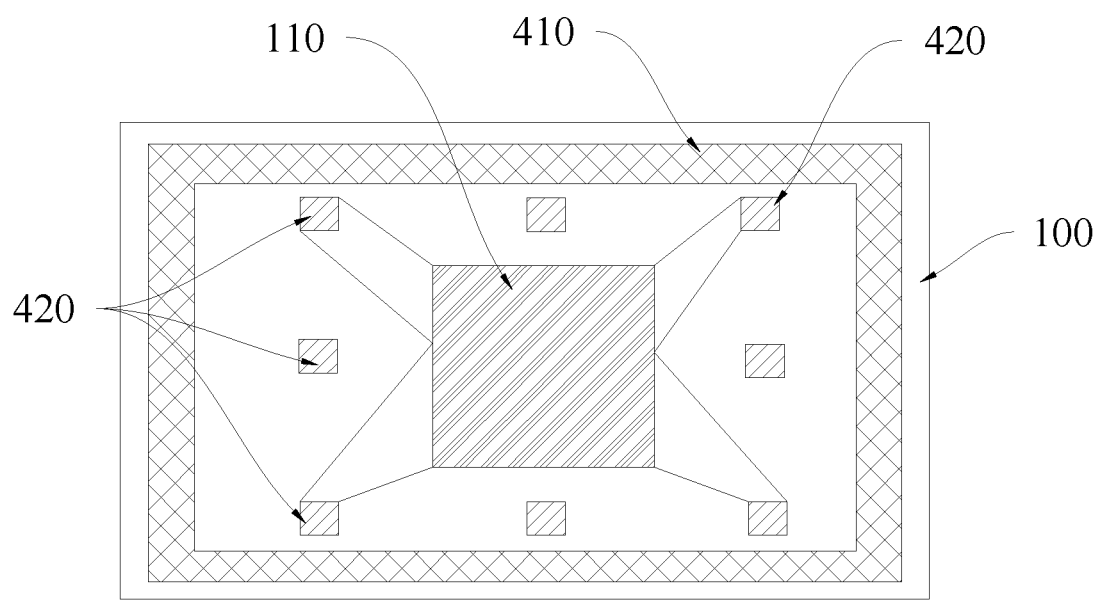
FIG. 8 is a schematic top view of an individual die in FIG. 7.

As illustrated in FIG. 6 and FIG. 8, the seal walls 410 are disposed around peripheries of the filters 110 and define enclosed chambers, and the support electrodes 420 are disposed in the enclosed chambers and between the filters 110 and the seal walls 410.

In S200, the finished wafer is cut into a plurality of dies.

Figure 7:
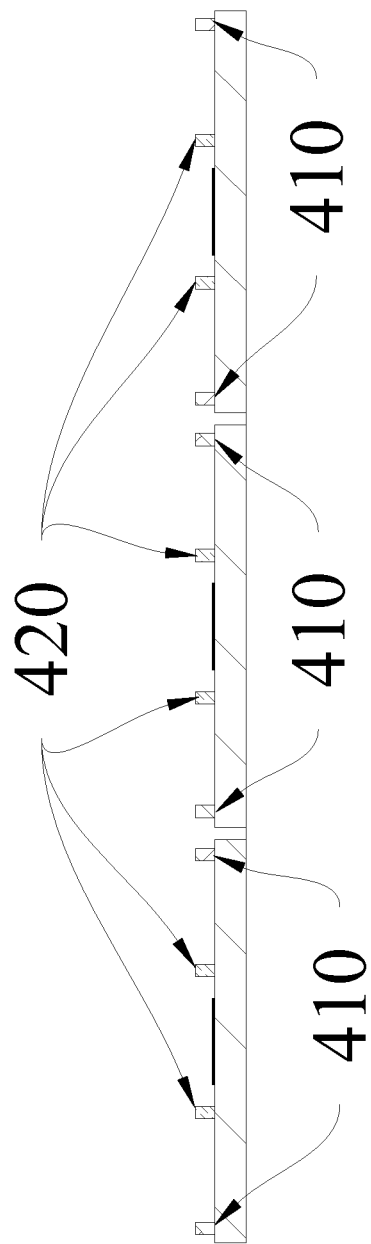
FIG. 7 is a schematic structural view of dies obtained in step S200 in FIG. 2.

As illustrated in FIG. 7 and FIG. 8, each of the dies includes the die substrate 100, the filter 110, the seal walls 410, and the support electrodes 420.

In S300, solder layers 460 are prepared on electrodes on the substrate 200, and solder resist layers 300 are disposed on peripheries of the solder layers 460 to obtain a finished substrate.

Figure 9:
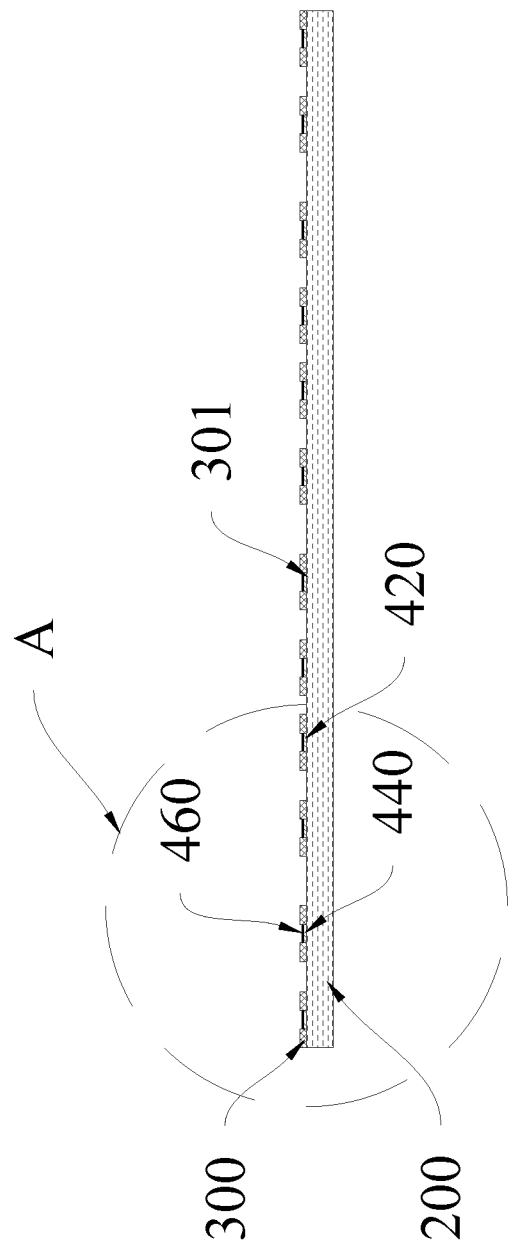
FIG. 9 is a schematic structural view of a finished substrate obtained in step S300 in FIG. 2.
Figure 10:
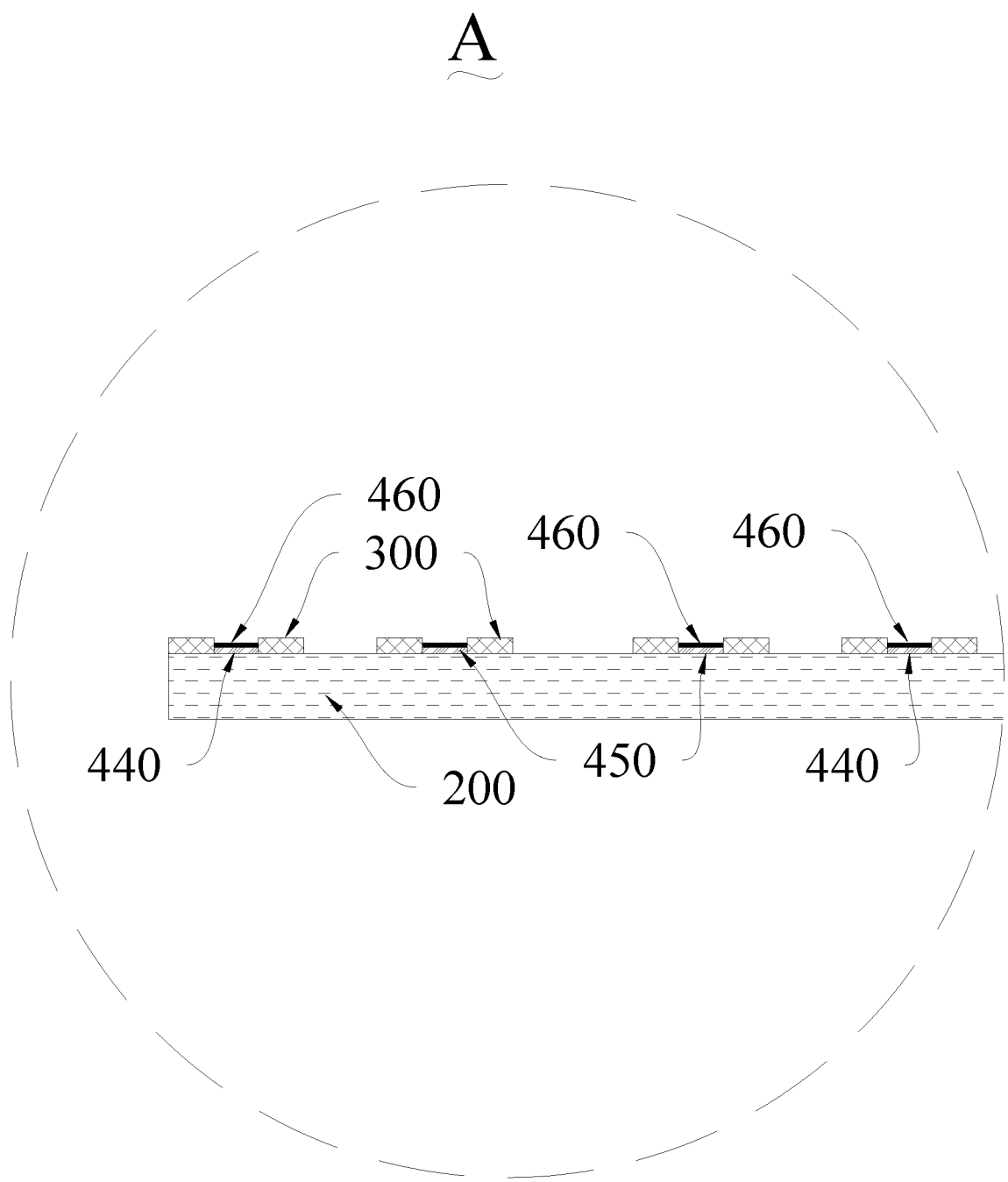
FIG. 10 is a partial enlarged view of part A in FIG. 9.

As illustrated in FIG. 9 and FIG. 10, a height of each of the solder resist layers 300 on the substrate 200 is greater than a height of each of the solder layers 460 on the substrate 200.

In S400, the dies are bonded and reflow soldered to the finished substrate, such that the seal walls 410 and the support electrodes 420 are connected to the electrodes on the finished substrate via the solder of the solder layers 46, and the solder structure is obtained.

Figure 11:
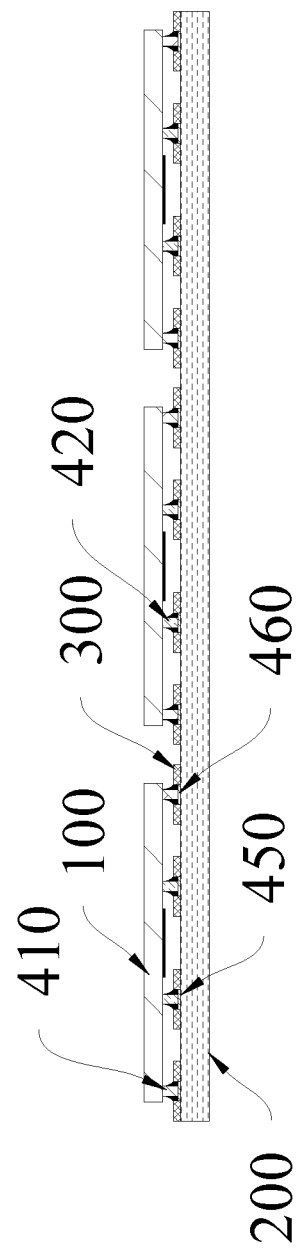
FIG. 11 is a schematic structural view of a solder structure obtained in step S400 in FIG. 2.

As illustrated in FIG. 11, in the solder structure, the seal walls 410 and the support electrodes 420 are connected to electrodes on the finished substrate, and the die substrate 100, the substrate 200, and the seal walls 410 enclose to define the enclosed chamber 500. The support electrodes 420 are disposed in the enclosed chambers 500.

In S500, a package layer 430 is disposed on the solder structure, and the package layer 430 was cut to obtain the filter package structure.

With the method according to this embodiment, the seal walls 410 and the support electrodes 420 each having a specific height are prepared on the wafer substrate of the filters, the prepared wafer substrate is cut into a plurality of individual dies, and the seal walls 410 and the support electrodes 420 on the die are connected to the first electrode connection layers 440 and the second electrode connection layers 450 on the substrate 200, such that the seal walls 410, the die substrate 100, and the substrate 200 define the enclosed chambers. In this way, the filters 110 are disposed in the enclosed chambers, and thus isolated from the external environment. With the method according to this embodiment, the wafer-class package structure of the traditional filters 110 is not needed, and instead the seal walls 410 are bonded and soldered to the first electrode connection layers 440 on the substrate 200 to achieve the seal effect; additionally, the package layer 430 is disposed outside the enclosed chambers. In this way, the sealing property of the filters 110 is improved, the stability of the products is ensured, the manufacture process is simplified and eased, the package period is shortened, and the manufacture cost is lowered.

In this embodiment, in step S300, the solder resist layers 300 are prepared by photolithography.

Figure 3:
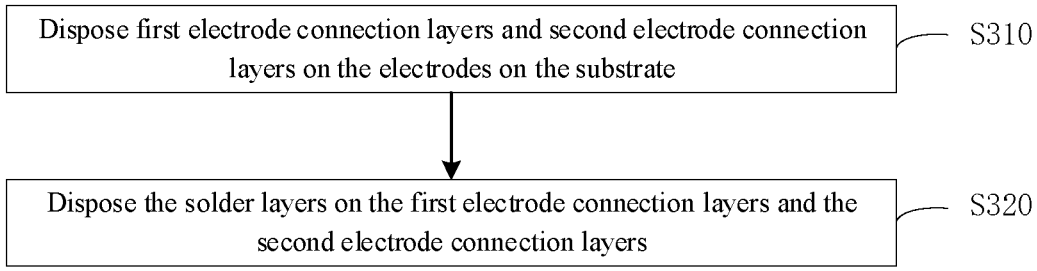
FIG. 3 is a schematic flowchart of step S300 in FIG. 2.

As illustrated in FIG. 3, in this embodiment, in step S300, preparing the solder layers 460 on the electrodes on the substrate 200 includes the following substeps.

In S310, first electrode connection layers 440 and second electrode connection layers 450 are disposed on the electrodes on the substrate 200.

In S320, the solder layers 460 are disposed on the first electrode connection layers 440 and the second electrode connection layers 450.

In this embodiment, in substep S310, the first electrode connection layers 440 and the second electrode connection layers 450 may be prepared by electroplating or electroless plating.

Figure 4:
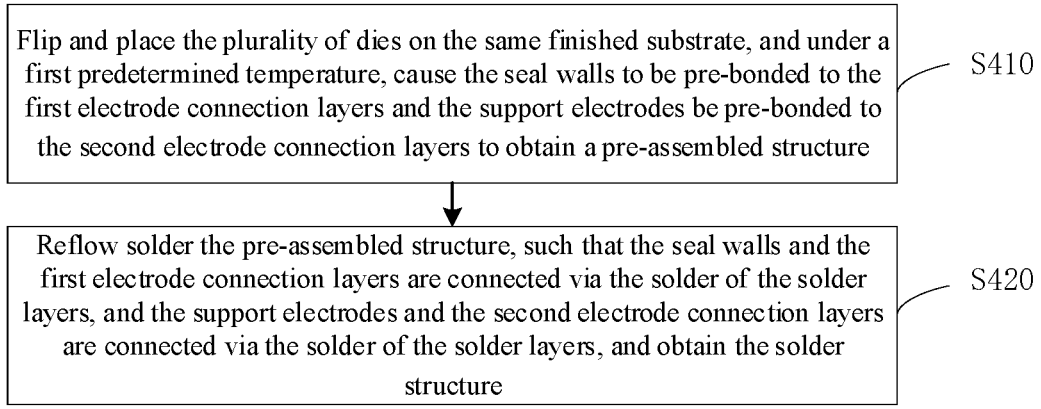
FIG. 4 is a schematic flowchart of step S400 in FIG. 2.

As illustrated in FIG. 4, in this embodiment, step S400 includes the following sub steps.

In S410, the plurality of dies are flipped and placed on the same finished substrate, and under a first predetermined temperature, the seal walls 410 are caused to be pre-bonded to the first electrode connection layers 440 and the support electrodes 420 are caused to be pre-bonded to the second electrode connection layers 450 to obtain a pre-assembled structure.

In the pre-assembled structure, the die substrate 100, the substrate 200, and the seal walls 410 enclose to define the enclosed chambers 500.

In S420, the pre-assembled structure is reflow soldered, such that the seal walls 410 and the first electrode connection layers 440 are connected via the solder of the solder layers 460, and the support electrodes 420 and the second electrode connection layers 450 are connected via the solder of the solder layers 460, and the solder structure is obtained.

The solder structure is an assembled structure formed of the plurality of dies and the finished substrate.

Specifically, the plurality of dies are flipped, such that the seal walls 410 and the support electrodes 420 on the dies are simultaneously pre-bonded to the first electrode connection layers 440 and the second electrode connection layers 450 respectively. In some embodiments, the predetermined temperature ranges from 100° C. to 230° C.

In this embodiment, the seal walls 410 and the first electrode connection layers 440, and the support electrodes 420 and the second electrode connection layers 450 are pre-connected by pre-bonding, and then further co-melting bonded by reflow soldering, such that the seal walls 410 and the first electrode connection layers 440, and the support electrodes 420 and the second electrode connection layers 450 are connected without any solder resist to form a solid conductive structure. In this way, the filters 110 are protected, the manufacture cost of packaging the filters 110 is lowered, and the manufacture period is shortened. By reflow soldering, the seal walls 410 and the first electrode connection layers 440 are co-melting bonded by reflow soldering, the support electrodes 420 and the second electrode connection layers 450 are co-melting bonded, and the material of the package layer 430 may be selected from any low-cost plastic packaging materials such as epoxy resin or polyimide, instead of specific organic film materials. In this way, the manufacture cost is greatly lowered, the packaging is simplified, and the reliability of the package structure is enhanced.

In this embodiment, a height of each of the solder resist layers 300 on the substrate 200 is greater than a height of the solder layers 460 on the substrate 200, such that during pre-bonding and reflow soldering of the solder layers 460, the solder resist layers 300 are capable of restricting flowing of the solder, and curing and shaping the solder. With the solder resist layers 300, the pre-bonding and the reflow soldering are simpler and more efficient.

In this embodiment, step S420 may include: placing the pre-assembled structure on a carrier board for fixing by mechanical fixing or vacuum fixing, placing a press board on the pre-assembled structure, and placing the pre-assembled structure into a vacuum heater for reflow soldering, such that the seal walls 410 are soldered to the first electrode connection layers 440, and the support electrodes 420 are soldered to the second electrode connection layers 450 to obtain the solder structure. The solder structure is an assembled structure formed of the plurality of dies and the finished substrate.

Figure 5:
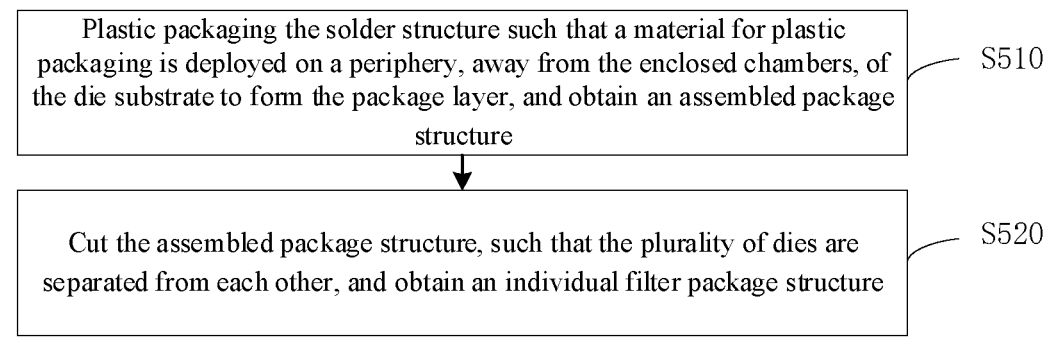
FIG. 5 is a schematic flowchart of step S500 in FIG. 2.

As illustrated in FIG. 5, in this embodiment, step S500 includes the following sub steps.

In S510, the solder structure is plastic packaged such that a material for plastic packaging is deployed on a periphery, away from the enclosed chambers 500, of the die substrate 100 to form the package layer 430, and an assembled package structure is obtained.

Figure 12:
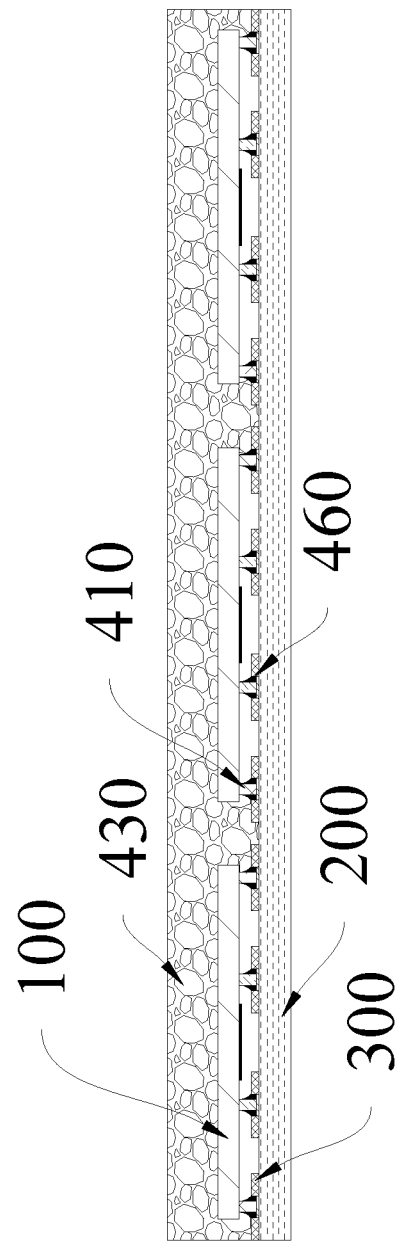
FIG. 12 is a schematic structural view of an assembled package structure obtain in step S510 in FIG. 5.

As illustrated in FIG. 12, the assembled package structure is an assembled structure formed of the plurality of dies and the finished substrate.

In S520, the assembled package structure is cut, such that the plurality of dies are separated from each other, and an individual filter package structure is obtained.

Specifically, the package layer 430 is made of epoxy resin. When the substrate 200 is a resin substrate, the package layer 430 may be made of epoxy resin having a thermal conductivity greater than 1 W. When the substrate 200 is a ceramic substrate, the package layer 430 may be made of epoxy resin having a thermal conductivity greater than 0.2 W.

In this embodiment, the package layer 430 is filled in the peripheries, away from the enclosed chambers 500, of the die substrate 100, and is covered on the outer sides of the die substrate 100, the seal walls 410, and the solder resist layers 300. In this way, the enclosed chambers are further sealed, and further a heat dissipation effect is achieved for the substrate 200 and the die substrate 100.

In this embodiment, the finished wafer is firstly cut into a plurality of dies, and the dies are flipped on the substrate 200, such that specific gaps are defined between the plurality of dies and the seal walls 410 on the same substrate 200. During plastic packaging of the solder structure, the plastic packaging material is filled in the gaps and above the die substrate 100 to form the package layer 430, and then the package layer 430 and the substrate 200 in the gaps are cut to obtain the individual filter package structures. With the method according to this embodiment, the plastic packaging is simplified and eased, and the prepared filter package structure is more reliable.

In some embodiments, prior to step S200, the method further includes: attaching a protective film on the finished wafer, wherein the protective film is attached on the seal walls 410 and one terminals, away from the wafer substrate of the filters 110, of the support electrodes 420, such that the filters 110 are in the enclosed chambers; and thinning the wafer substrate of the filters.

In some embodiments, prior to step S400, the method further includes: releasing the protective film from the seal walls 410 and the support electrodes 420.

It should be noted that during thinning the wafer substrate of the filters, the protective film is constantly not in contact with the filters 110.

The finished wafer may be cut by mechanical cutting or laser cutting. Depending on different cutting fashions, releasing the protective film from the seal walls 410 and the support electrodes 420 may be performed in different manufacture steps.

In some embodiments, upon thinning of the wafer substrate of the filters, where the finished wafer is cut by mechanical dicing, upon mechanical cutting of the finished wafer, an adhesiveness of the protective film is lowered by ultraviolet irradiation, and then the protective film is released from the seal walls 410 and the support electrodes 420 in a tape releasing fashion.

In some embodiments, upon thinning of the wafer substrate of the filters, where the finished wafer is cut by laser dicing, upon thinning, an adhesiveness of the protective film is lowered by ultraviolet irradiation, then the protective film is released from the seal walls 410 and the support electrodes 420 in a tape releasing fashion, and finally the finished wafer is cut by laser.

It may be understood that releasing the protective film from the seal walls 410 and the support electrodes 420 only needs to be completed prior to bonding and reflow soldering the dies to the finished substrate.

In this embodiment, prior to cutting the finished wafer, the protective film is attached on the seal walls 410 and the support electrodes 420, such that the seal walls 410, the protective film, and the die substrate 100 define the enclosed chambers. In this way, external moistures or particles are prevented from causing damages to the filters 110 during the cutting.

In this embodiment, a thickness of the protective film is greater than 20 μm, such that the protective film is not in contact with the filters 110 when being attached to the seal walls 410 and the support electrodes 420. The protective film may be attached to the seal walls 410 and the support electrodes 420 by thermosetting or photosensing.

In this embodiment, the filters 110 include SAW filters and BAW filters.

The filter package structure according to the embodiments of the present disclosure may be prepared using the method for preparing the filter package structure according to any of the above embodiments.

It is apparent that the embodiments described above are only exemplary ones, but not all embodiments of the present disclosure, and the attached drawings illustrate exemplary embodiments of the present disclosure but do not limit the scope of the present disclosure. The present disclosure may be embodied in many different forms and, on the contrary, these embodiments help thorough and better understanding of the present disclosure. Although the present disclosure has been described in detail with reference to the above embodiments, those skilled in the art will be able to make modifications to the technical solutions disclosed in the specific embodiments or make equivalent substitutions for some of the technical features. Where an equivalent structure made by using the contents of the specification and the drawings of the present disclosure is directly or indirectly applied to other relevant technical fields, it is likewise within the scope of protection of the present disclosure.

What is claimed is:

1. A method for preparing a filter package structure, comprising:
    preparing seal walls and support electrodes on a wafer substrate of filters to obtain a finished wafer, wherein the seal walls are respectively disposed around a peripheries of the filters to define enclosed chambers, and the support electrodes are respectively disposed in the enclosed chambers and between the filters and the seal walls;
    cutting the finished wafer into a plurality of dies, wherein each of the dies comprises a die substrate, a filter, the seal walls and the support electrodes;
    preparing solder layers on electrodes on a substrate, and disposing solder resist layers on peripheries of the solder layer to obtain a finished substrate, wherein a height of the solder resist layers on the substrate is greater than a height of the solder layers on the substrate;
    bonding and reflow soldering the plurality of dies to the finished substrate such that the seal walls and the support electrodes are connected to the electrodes on the finished substrate via a solder of the solder layers to obtain a solder structure, wherein in the solder structure, the die substrate, the substrate and the seal walls enclose to define an enclosed chamber, and the support electrodes are disposed in the enclosed chamber; and
    disposing a package layer on the solder structure, and cutting the package layer to obtain the filter package structure; wherein
    preparing the solder layers on the electrodes on the substrate comprises:
    disposing first electrode connection layers and second electrode connection layers on the electrodes on the substrate; and
    disposing the solder layers on the first electrode connection layers and the second electrode connection layers;
    bonding and reflow soldering the plurality of dies to the finished substrate such that the seal walls and the support electrodes are connected to the electrodes on the finished substrate via the solder of the solder layers to obtain the solder structure comprises:
    flipping and placing the plurality of dies on the same finished substrate, and under a first predetermined temperature, causing the seal walls to be pre-bonded to the first electrode connection layers and causing the support electrodes to be pre-bonded to the second electrode connection layers to obtain a pre-assembled structure, wherein in the pre-assembled structure, the die substrate, the substrate, and the seal walls enclose to define the enclosed chambers; and
    reflow soldering the pre-assembled structure such that the seal walls and the first electrode connection layers are connected via the solder of the solder layers and the support electrodes and the second electrode connection layers are connected via the solder of the solder layers, and obtaining the solder structure, wherein the solder structure is an assembled structure formed of the plurality of dies and the finished substrate.

2. The method according to claim 1, wherein disposing the package layer on the solder structure, and cutting the package layer to obtain the filter package structure comprise:
    plastic packaging the solder structure such that a material for plastic packaging is deployed on a periphery, away from the enclosed chambers, of the die substrate to form the package layer, and obtaining an assembled package structure, wherein the assembled package structure is an assembled structure formed of the plurality of dies and the finished substrate; and
    cutting the assembled package structure such that the plurality of dies are separated from each other, and obtaining an individual filter package structure.

3. The method according to claim 1, wherein prior to cutting the finished wafer into the plurality of dies, the method further comprises:
    attaching a protective film on the finished wafer, wherein the protective film is attached on the seal walls, and one terminal, away from the wafer substrate of the filter, of the support electrodes, such that the filters are in the enclosed chambers; and
    thinning the wafer substrate of the filters; and
    prior to bonding and reflow soldering the plurality of dies to the finished substrate, the method further comprises:
    releasing the protective film from the seal walls and the support electrodes.

4. A filter package structure, prepared by the method according to claim 1, wherein the filter package structure comprises:
    a die substrate, a substrate, a solder resist layer, a package layer, and a conductive structure disposed between the die substrate and the substrate; wherein
    the solder resist layer is disposed on the substrate, and a plurality of channels are formed in the solder resist layer, each of the channels being provided with a solder;
    the conductive structure comprises a seal wall and a support electrode, the seal wall and one terminal of the support electrode being connected to the die substrate, and the seal wall and the other terminal of the support electrode being disposed in one of the channels and connected to the substrate via the solder; and
    the die substrate is provided with a filter, wherein the seal wall is disposed around a periphery of the filter, the die substrate, the substrate and the seal wall enclose to define an enclosed chamber, the support electrode is disposed in the enclosed chamber and between the filter and the seal wall, and the package layer is disposed on a periphery, far away from the enclosed chamber, of the die substrate.

5. The filter package structure according to claim 4, wherein a difference between a height of the seal wall on the die substrate and a height of the support electrode on the die substrate is less than 1 μm.

6. The filter package structure according to claim 4, wherein a height of the seal wall on the die substrate ranges from 5 to 30 μm, and a height of the support electrode on the die substrate ranges from 5 to 30 μm.

7. The filter package structure according to claim 4, wherein at least two support electrodes are disposed, and the two support electrodes are symmetrically distributed about a central line of the filter.

8. The filter package structure according to claim 4, wherein the conductive structure further comprises a first electrode connection layer and a second electrode connection layer, the first electrode connection layer and the second electrode connection layer being both disposed on the substrate; wherein the first electrode connection layer is in correspondence with the seal wall and the seal wall is connected to the first electrode connection layer via the solder such that the die substrate, the substrate, the seal wall and the first electrode connection layer enclose to define the enclosed chamber, and the second electrode connection layer is in correspondence with the support electrode, and the support electrode is connected to the second electrode connection layer via the solder; and the first electrode connection layer and the second electrode connection layer are both disposed in the channel, a height of the solder resist layer on the substrate is greater than a height of the first electrode connection layer on the substrate, and the height of the solder resist layer on the substrate is greater than a height of the second electrode connection layer on the substrate.

* * * * *